United States Patent
Yang et al.

(10) Patent No.: US 9,773,447 B2
(45) Date of Patent: Sep. 26, 2017

(54) ARRAY SUBSTRATE AND MANUFACTURING METHOD THEREOF, AND DISPLAY DEVICE

(71) Applicants: BOE Technology Group Co., Ltd., Beijing (CN); Beijing BOE Optoelectronics Technology Co., Ltd., Beijing (CN)

(72) Inventors: Jiuxia Yang, Beijing (CN); Feng Bai, Beijing (CN); Jiantao Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 115 days.

(21) Appl. No.: 14/745,814

(22) Filed: Jun. 22, 2015

(65) Prior Publication Data

US 2016/0253954 A1    Sep. 1, 2016

(30) Foreign Application Priority Data

Feb. 28, 2015  (CN) .......................... 2015 1 0092283

(51) Int. Cl.
*G09G 5/10*    (2006.01)
*G09G 3/3208*    (2016.01)
(Continued)

(52) U.S. Cl.
CPC ....... *G09G 3/3208* (2013.01); *H01L 27/3209* (2013.01); *H01L 27/3211* (2013.01);
(Continued)

(58) Field of Classification Search
CPC ............... G09G 3/2003; G09G 3/3208; G09G 2320/028; G09G 2320/0666;
(Continued)

(56) References Cited

U.S. PATENT DOCUMENTS 6,171,772 B1 *  1/2001  Ikeda ................... G03C 7/3041
                                                         430/544
6,486,507 B1 * 11/2002  Saito .................... H01L 27/115
                                                         257/315
(Continued)

FOREIGN PATENT DOCUMENTS

CN          1615059 A      5/2005
JP          2007059124 A   3/2007
JP          2012-059587 A  3/2012

OTHER PUBLICATIONS

May 31, 2016—(CN)—First Office Action Appn 201510092283.1 with English Tran.

*Primary Examiner* — Prabodh M Dharia
(74) *Attorney, Agent, or Firm* — Banner & Witcoff, Ltd.

(57) ABSTRACT

An array substrate and a manufacturing method thereof, and a display device are provided. The array substrate includes: a first electrode, a second electrode and a light-emitting functional layer located between the first electrode and the second electrode. The light-emitting functional layer at least includes an organic light-emitting material layer of a first color and an organic light-emitting material layer of a second color, a color decay rate of the organic light-emitting material layer of the first color being greater than a color decay rate of the organic light-emitting material layer of the second color. The organic light-emitting material layer of the first color at least includes a first sub-layer and a second sub-layer arranged in a stacking manner, and a third electrode is disposed between the first sub-layer and the second sub-layer.

20 Claims, 5 Drawing Sheets

(51) Int. Cl.
 *H01L 51/52* (2006.01)
 *H01L 51/50* (2006.01)
 *H01L 27/32* (2006.01)

(52) U.S. Cl.
 CPC ...... *H01L 51/5044* (2013.01); *H01L 51/5206* (2013.01); *H01L 51/5221* (2013.01); *G09G 2300/0452* (2013.01); *G09G 2320/0666* (2013.01); *G09G 2360/145* (2013.01)

(58) Field of Classification Search
 CPC ..... G09G 2360/145; G09G 2300/0452; G09G 2330/028; H01L 51/5221; H01L 51/5206; H01L 51/504
 USPC ....... 345/76, 690; 313/503, 504; 257/13, 40, 257/315
 See application file for complete search history.

(56) References Cited

U.S. PATENT DOCUMENTS

| | | | | |
|---|---|---|---|---|
| 8,564,195 | B2* | 10/2013 | Ha | H01L 51/5008 313/504 |
| 9,099,416 | B2* | 8/2015 | Jung | H01L 51/5225 |
| 9,164,641 | B1* | 10/2015 | Rowe | G06F 3/044 |
| 9,450,028 | B2* | 9/2016 | Chou | H01L 27/3211 |
| 2004/0036421 | A1 | 2/2004 | Arnold et al. | |
| 2004/0257541 | A1* | 12/2004 | Iisaka | G02B 5/201 353/84 |
| 2007/0046180 | A1* | 3/2007 | Kao | H01L 51/5265 313/504 |
| 2007/0120465 | A1* | 5/2007 | Ito | G02F 1/133555 313/504 |
| 2007/0159085 | A1* | 7/2007 | Kuma | C09K 11/06 313/506 |
| 2007/0211084 | A1* | 9/2007 | Ohtani | H01L 27/3209 345/690 |
| 2008/0191621 | A1* | 8/2008 | Ha | H01L 51/5008 313/506 |
| 2008/0224595 | A1* | 9/2008 | Nakamata | H01L 51/5265 313/500 |
| 2009/0026918 | A1* | 1/2009 | Chen | C09K 11/7775 313/503 |
| 2009/0174628 | A1* | 7/2009 | Wang | G09G 3/3225 345/76 |
| 2009/0309109 | A1* | 12/2009 | Chang | H01L 27/3211 257/89 |
| 2010/0176412 | A1* | 7/2010 | Yokoyama | H01L 51/5036 257/98 |
| 2010/0276671 | A1* | 11/2010 | Sarma | H01L 27/3262 257/40 |
| 2010/0295421 | A1* | 11/2010 | Takeuchi | H01L 23/562 310/340 |
| 2011/0062427 | A1* | 3/2011 | Jeong | H01L 51/5036 257/40 |
| 2011/0121716 | A1* | 5/2011 | Yoo | C09K 11/57 313/487 |
| 2014/0191036 | A1* | 7/2014 | Manion | G06K 19/0614 235/454 |
| 2015/0014627 | A1* | 1/2015 | Yu | H01L 27/14665 257/13 |
| 2015/0124004 | A1* | 5/2015 | Hayashi | G09G 3/3233 345/690 |
| 2016/0020352 | A1* | 1/2016 | Konstantatos | H01L 31/035218 257/24 |

* cited by examiner

US 9,773,447 B2

ARRAY SUBSTRATE AND MANUFACTURING METHOD THEREOF, AND DISPLAY DEVICE

This application claims priority to Chinese Patent Application No. 201510092283.1 filed on Feb. 28, 2015. The present application claims priority to and the benefit of the above-identified application and is incorporated herein in its entirety.

TECHNICAL FIELD

Embodiments of the invention relate to an array substrate and a manufacturing method thereof, and a display device.

BACKGROUND

An organic light-emitting diode (OLED) display has been widely used in a field of display technology. A basic structure of the OLED display includes an anode, a light-emitting functional layer and a cathode, wherein the light-emitting functional layer is made of an organic light-emitting material.

The OLED implements color display generally in two ways: one is to implement the color display by using a white-light organic light-emitting material in combination with a color filter. Since part of light is absorbed by the color filter, display luminance is reduced by using such a method to implement the color display.

The other way is to evaporate organic light-emitting materials of different primary colors by using a fine metal mask (FMM) to form respective pixels. However, since a blue organic light-emitting material layer decays more rapidly, and a red organic light-emitting material layer and a green organic light-emitting material layer decay more slowly, after long time of display, a color coordinate of a device drifts away from white balance, and a red shift phenomenon occurs, that is, the white balance is warm-toned in full-color display, which severely affects a display effect of the display, that is, shortens a display life.

However, in the prior art, decay of the organic light-emitting materials of different colors is generally balanced by increasing an area of the blue organic light-emitting material in the pixels, but increase of the area will result in a reduced display resolution.

SUMMARY OF THE INVENTION

An embodiment of the invention provides an array substrate, comprising a base substrate; a first electrode, a second electrode and a light-emitting functional layer located between the first electrode and the second electrode, which are formed on the base substrate, wherein, the light-emitting functional layer at least includes an organic light-emitting material layer of a first color and an organic light-emitting material layer of a second color, a color decay rate of the organic light-emitting material layer of the first color being greater than a color decay rate of the organic light-emitting material layer of the second color; and the organic light-emitting material layer of the first color at least includes a first sub-layer and a second sub-layer arranged in a stacking manner, and a third electrode is disposed between the first sub-layer and the second sub-layer.

Another embodiment of the invention provides a display device comprising the above array substrate.

Still another embodiment provides a display compensation method, applied in the above display device, the method comprising:

applying an anode signal and a cathode signal to the first electrode and the second electrode, respectively;

obtaining luminance information of the display device;

determining whether to perform a display compensation on the display device or not, according to the luminance information; and upon the display compensation being performed, applying an anode signal and a cathode signal to the third electrode and the second electrode respectively and stopping applying a voltage signal to the first electrode; or, applying an anode signal and a cathode signal to the first electrode and the second electrode respectively and stopping applying a voltage signal to the third electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An array substrate provided by an embodiment of the present invention can be applied in an OLED display device; and in order to facilitate understanding of technical solutions of the present invention, a display principle of the OLED and a conventional OLED array substrate will be introduced at first.

Conventional display devices all include a plurality of pixels, wherein each pixel includes sub-pixels of different colors such as red, green and blue, or red, green, blue and white, or red, green, blue and yellow; the color displayed by each pixel is a color after mixing the colors displayed by respective sub-pixels, then, the pixels can be controlled to implement different colors, by controlling the display of the respective sub-pixels, and further a display panel can implement colorful display.

Figure 1:
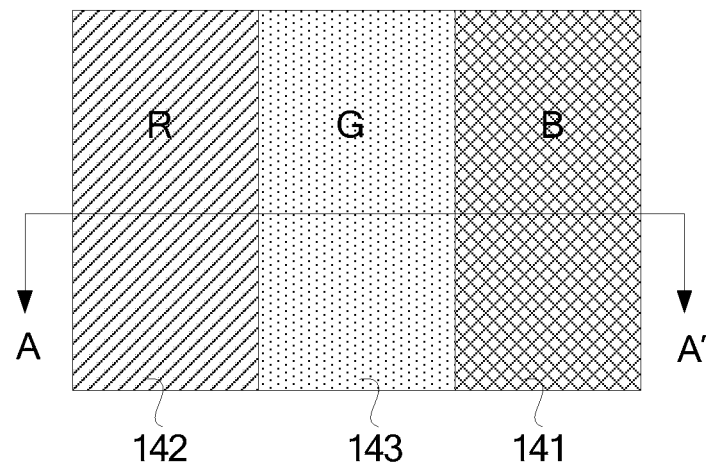
FIG. 1 is a schematic diagram of a conventional pixel structure.
Figure 2:
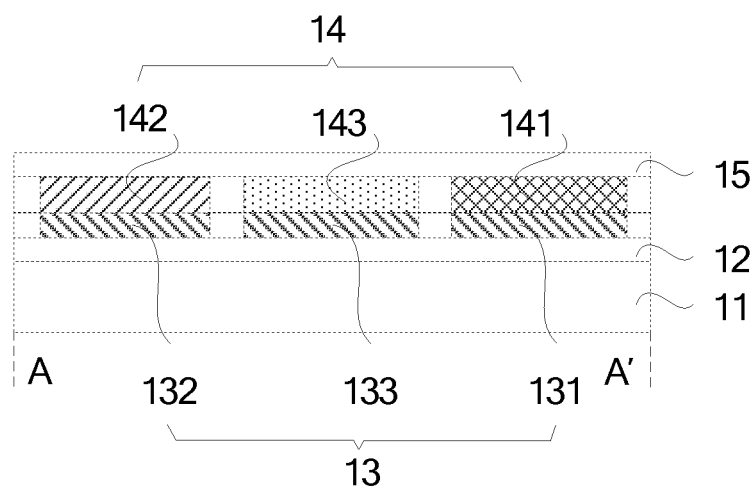
FIG. 2 is a schematic diagram of a pixel structure corresponding to FIG. 1 in a conventional array substrate.

As illustrated in FIG. 1, a pixel 10 on the array substrate is taken as an example, wherein, the pixel 10 includes a red (R) sub-pixel, a green (G) sub-pixel, and a blue (B) sub-pixel. As illustrated in FIG. 2, the array substrate comprises: a glass substrate 11 and a TFT array 12 formed on the glass substrate 11, a first electrode (a pixel electrode) 13, a light-emitting functional layer 14 and a second electrode 15. A blue organic light-emitting material layer 141 covers a first pixel electrode 131 to form a blue sub-pixel, a red organic light-emitting material layer 142 covers a second pixel electrode 132 to form a red sub-pixel, and a green organic light-emitting material layer 143 covers a third pixel electrode 133 to form a green sub-pixel. Since the organic light-emitting material layer is located between the second electrode 15 and the first electrode 13, when the second electrode 15 and the first electrode 13 are applied with voltages simultaneously, the sub-pixel corresponding to the pixel electrode 13 emits light, and a luminance of the sub-pixel can be controlled by controlling magnitudes of the voltages applied on the second electrode 15 and the first electrode 13. The first electrode and the second electrode are an anode and a cathode, respectively. The embodiments of the present invention will be described in detail with the first electrode being an anode, and the second electrode being a cathode as an example.

However, as the organic light-emitting material layer is used over time, a color decay rate of the blue organic light-emitting material layer is greater than color decay rates of the red organic light-emitting material layer and of the green organic light-emitting material layer, such that a color shift is great after the colors of the three sub-pixels are mixed; moreover, the longer the service time, the more severe the decay of the blue organic light-emitting material layer, which will severely affect the display effect of the display device. The color decay rate means a velocity at which a luminance of a light emitting layer decays under a certain voltage.

It should be noted that, there are many thin films or layer structures comprised on the array substrate, but the embodiments of the present invention only list the thin films or the layer structures associated with inventive points of the present invention, and the prior art can be referred to for the layer structures having other functions, which will not be listed and repeated by the embodiments of the present invention one by one.

Figure 3:
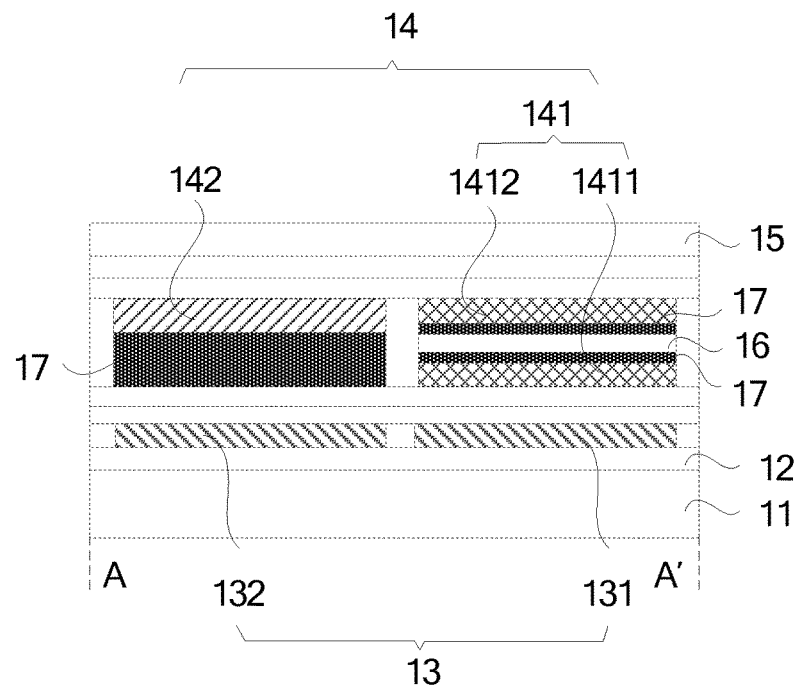
FIG. 3 is a schematic diagram of an array substrate provided by an embodiment of the present invention.

An embodiment of the present invention provides an array substrate, as illustrated in FIG. 3, comprising: a base substrate 11; a first electrode 13 and the second electrode 15 as well as a light-emitting functional layer 14 located between the first electrode 13 and the second electrode 15, which are formed on the base substrate 11. The light-emitting functional layer 14 at least includes an organic light-emitting material layer of a first color (the blue organic light-emitting material layer 141), and an organic light-emitting material layer of a second color (the red organic light-emitting material layer 142); a color decay rate of the organic light-emitting material layer of the first color being greater than a color decay rate of the organic light-emitting material layer of the second color, that is, a color decay rate of the blue organic light-emitting material layer 141 being greater than a color decay rate of the red organic light-emitting material layer 142.

The organic light-emitting material layer of the first color at least includes a first sub-layer and a second sub-layer arranged in a stacking manner, and a third electrode is disposed between the first sub-layer and the second sub-layer. Of course, the organic light-emitting material layer of the first color may further include a third sub-layer, or a fourth sub-layer, etc. In the embodiment of the present invention, the organic light-emitting material layer of the first color including the first sub-layer and the second sub-layer is taken as an example. As illustrated in FIG. 3, the blue organic light-emitting material layer 141 includes a first sub-layer 1411 and a second sub-layer 1412, and a third electrode 16 is disposed between the first sub-layer 1411 and the second sub-layer 1412.

As illustrated in FIG. 3, the light-emitting functional layer 14 is located between the first electrode 13 and the second electrode 15, the organic light-emitting material layer of the first color (the blue organic light-emitting material layer 141) includes the first sub-layer 1411 and the second sub-layer 1412, and the third electrode 16 is disposed between the first sub-layer 1411 and the second sub-layer 1412. In a case that the first electrode 13 and the second electrode 15 are respectively loaded with an anode signal and a cathode signal, the first sub-layer 1411 and the second sub-layer 1412 of the blue organic light-emitting material layer 141 both emit light and display; in a case that the first electrode 13 and the third electrode 16 are respectively loaded with an anode signal and a cathode signal, the first sub-layer 1411 located between the first electrode 13 and the third electrode 16 emits light and displays, and the second sub-layer 1412 is turned off; and in a case that the third electrode 16 and the second electrode 15 are respectively loaded with an anode signal and a cathode signal, the second sub-layer 1412 located between the third electrode 16 and the second electrode 15 emits light and displays, and the first sub-layer 1411 is turned off.

It should be noted that, in FIG. 3, the light-emitting functional layer only including the organic light-emitting material layer of the first color and the organic light-emitting material layer of the second color is taken as an example. And in a case that the color decay rate of the organic light-emitting material layer of the first color is greater than the color decay rate of the organic light-emitting material layer of the second color, the organic light-emitting material layer of the first color and the organic light-emitting material layer of the second color may be organic light-emitting material layers of any colors. The embodiments of the present invention will be described in detail with the organic light-emitting material layer of the first color being a blue organic light-emitting material layer, and the organic light-emitting material layer of the second color being a red organic light-emitting material layer as an example.

The color decay rate of the blue organic light-emitting material layer is greater than the color decay rate of the red organic light-emitting material layer; however, the blue organic light-emitting material layer includes two sub-layers, so the display device can improve the display effect by decay compensation of the two sub-layers, thus prolonging the service life of the display device. Specifically, the display device may display by using the first sub-layer at an initial use phase, and when the first sub-layer decays severely as time goes by, it may switch to display by using the second sub-layer, or display by using the first sub-layer and the second sub-layer simultaneously, so as to perform display compensation on the blue organic light-emitting material layer. Of course, the display device may also display by using the second sub-layer at the initial use phase, and when the second sub-layer decays severely as time goes by, it may switch to display by using the first sub-layer, or display by using the first sub-layer and the second sub-layer simultaneously, so as to perform display compensation on the blue organic light-emitting material layer.

In the array substrate provided by the embodiment of the present invention, the color decay rate of the organic light-emitting material layer of the first color is greater than the color decay rate of the organic light-emitting material layer of the second color, and the organic light-emitting material layer of the first color includes at least two sub-layers, i.e., the first sub-layer and the second sub-layer arranged in a stacking manner, then the display device can perform the decay compensation by using the two sub-layers, specifically, it may display by using the first sub-layer firstly, and in the case that the first sub-layer decays severely, it may switch to display by using the second sub-layer, or display by using the first sub-layer and the second sub-layer simultaneously, so as to improve the display effect and prolong the service life of the display device.

In one example, as illustrated in FIG. 3, the third electrode 16 is provided with a micro-cavity structure adjustment layer 17 on a side of the third electrode 16 adjacent to the first sub-layer 1411 and/or a side of the third electrode 16 adjacent to the second sub-layer 1412; and the micro-cavity structure adjustment layer 17 is used for adjusting carrier balance, and can also planarize a surface of the light-emitting functional layer, that is, make the light-emitting functional layer have a uniform thickness, thus avoiding an uneven surface of the light-emitting functional layer because the first organic light-emitting material layer includes two sub-layers, i.e., the first sub-layer and the second sub-layer arranged in a stacking manner. In FIG. 3, it is described with the third electrode 16 being provided with the micro-cavity structure adjustment layer 17 on the side of the third electrode 16 adjacent to the first sub-layer 1411 and the side of the third electrode 16 adjacent to the second sub-layer 1412 as an example; of course, the third electrode 16 may also be provided with the micro-cavity structure adjustment layer 17 on only one side thereof.

It should be noted that, the micro-cavity structure adjustment layer is used for adjusting the carrier balance; if the first electrode is an anode, and the third electrode is a cathode, then the micro-cavity structure adjustment layer on the side of the third electrode adjacent to the first electrode may include an electron injection functional layer, an electron transport functional layer, or a laminated layer of the above-described two functional layers. If the third electrode is an anode, and the second electrode is a cathode, then the micro-cavity structure adjustment layer on the side of the third electrode adjacent to the second electrode may include a hole injection functional layer, a hole transport functional layer, or a laminated layer of the above-described two functional layers. That is, if the third electrode serves as an anode, the micro-cavity structure adjustment layer may include a hole injection functional layer, a hole transport functional layer, or a laminated layer of the above-described two functional layers; and if the third electrode serves as a cathode, the micro-cavity structure adjustment layer may include an electron injection functional layer, an electron transport functional layer, or a laminated layer of the above-described two functional layers.

It should be noted that, it may be determined whether the first electrode, the second electrode and the third electrode are an anode or a cathode or not in accordance with a specific input signal. However, since polarities of the first electrode, the second electrode and the third electrode affect settings of other functional layers such as the micro-cavity structure adjustment layer, before manufacturing of the array substrate, the polarities of the first electrode, the second electrode and the third electrode are determined, so as to determine a specific setting of the micro-cavity structure adjustment layer according to their polarities. Structures of the micro-cavity structure adjustment layers for the organic light-emitting material layers of different colors below are the same, and will not be repeated hereinafter.

Optionally, the array substrate further comprises a conductive transport layer, the conductive transport layer being insulated from the first electrode and the second electrode, and the conductive transport layer being electrically connected with the third electrode, and transmitting an electrical signal to the third electrode. Since an electric field is formed between the third electrode and the first electrode or the second electrode to drive the first sub-layer or the second sub-layer to emit light, the third electrode is electrically connected with a driving module via other connecting lines so as to receive the electrical signal. For example, the driving module may be electrically connected with the third electrode directly via a connecting lead, to transmit the electrical signal to the third electrode. The array substrate may be, as illustrated in FIG. 3, further provided with an insulating layer on the second electrode (to be insulated from the second electrode), and then provided with the conductive transport layer on the insulating layer, the conductive transport layer being electrically connected with the third electrode through a via hole, and transmitting the electrical signal to the third electrode.

Of course, there are a variety of modes in which the driving module transmits the electrical signal to the third electrode, and the embodiments of the present invention will be described in detail only with the above as an example.

For example, the organic light-emitting material layer of the second color is provided with the micro-cavity structure adjustment layer on a side of the organic light-emitting material layer of the second color adjacent to the first electrode and/or a side of the organic light-emitting material layer of the second color adjacent to the second electrode, and the micro-cavity structure adjustment layer is used for adjusting the carrier balance, and can also planarize a surface of the light-emitting functional layer, that is, make the light-emitting functional layer have a uniform thickness, thus avoiding an uneven surface of the light-emitting functional layer because the first organic light-emitting material layer includes two sub-layers, i.e., the first sub-layer and the second sub-layer arranged in a stacking manner.

For example, in FIG. 3, it is described with the organic light-emitting material layer of the second color (the red organic light-emitting material layer 142) being provided with the micro-cavity structure adjustment layer 17 on the side of the organic light-emitting material layer of the second color adjacent to the first electrode 13 as an example. If the first electrode 13 is an anode, the micro-cavity structure adjustment layer 17 formed on the side of the red organic light-emitting material layer 142 adjacent to the first electrode may include a hole injection functional layer, a hole transport functional layer, or a laminated layer of the above-described two functional layers. If the first electrode 13 is a cathode, the micro-cavity structure adjustment layer 17 formed on the side of the red organic light-emitting material layer 142 adjacent to the first electrode may include an electron injection functional layer, an electron transport functional layer, or a laminated layer of the above-described two functional layers.

If the second electrode is an anode, the micro-cavity structure adjustment layer formed on the side of the red organic light-emitting material layer adjacent to the second electrode may include a hole injection functional layer, a hole transport functional layer, or a laminated layer of the above-described two functional layers. If the second electrode is a cathode, the micro-cavity structure adjustment layer formed on the side of the red organic light-emitting material layer adjacent to the second electrode may include an electron injection functional layer, an electron transport functional layer, or a laminated layer of the above-described two functional layers.

Figure 4:
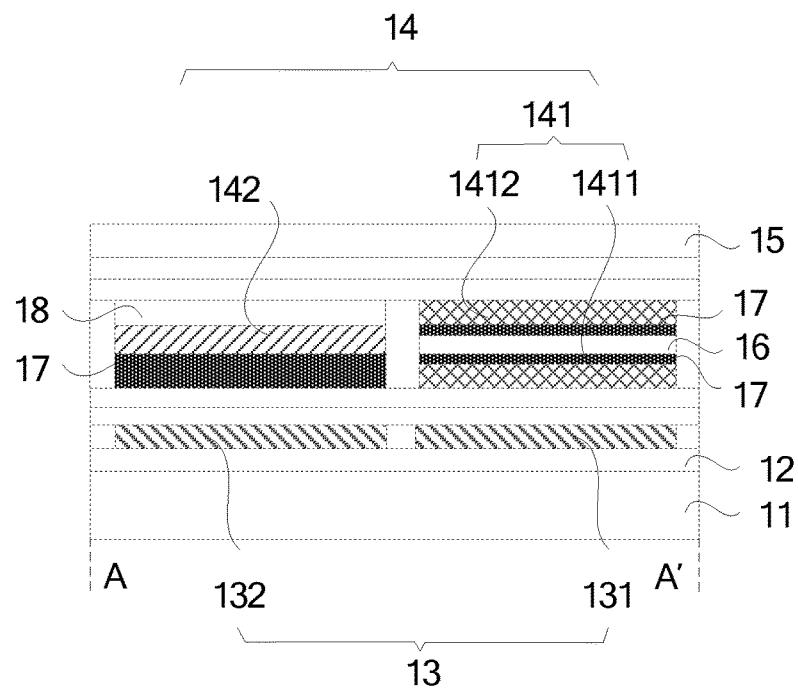
FIG. 4 is a schematic diagram of another array substrate provided by an embodiment of the present invention.

Optionally, the organic light-emitting material layer of the second color is provided with a planarization layer on a side of the organic light-emitting material layer of the second color adjacent to the first electrode and/or a side of the organic light-emitting material layer of the second color adjacent to the second electrode. As illustrated in FIG. 4, it is described in detail with the organic light-emitting material layer of the second color (the red organic light-emitting material layer 142) being provided with a planarization layer 18 on the side of the organic light-emitting material layer of the second color adjacent to the second electrode 15 as an example. The planarization layer planarizes a surface of the light-emitting functional layer, that is, makes the light-emitting functional layer have a uniform thickness, thus avoiding an uneven surface of the light-emitting functional layer because the first organic light-emitting material layer includes two sub-layers, i.e., the first sub-layer and the second sub-layer arranged in a stacking manner.

Figure 5:
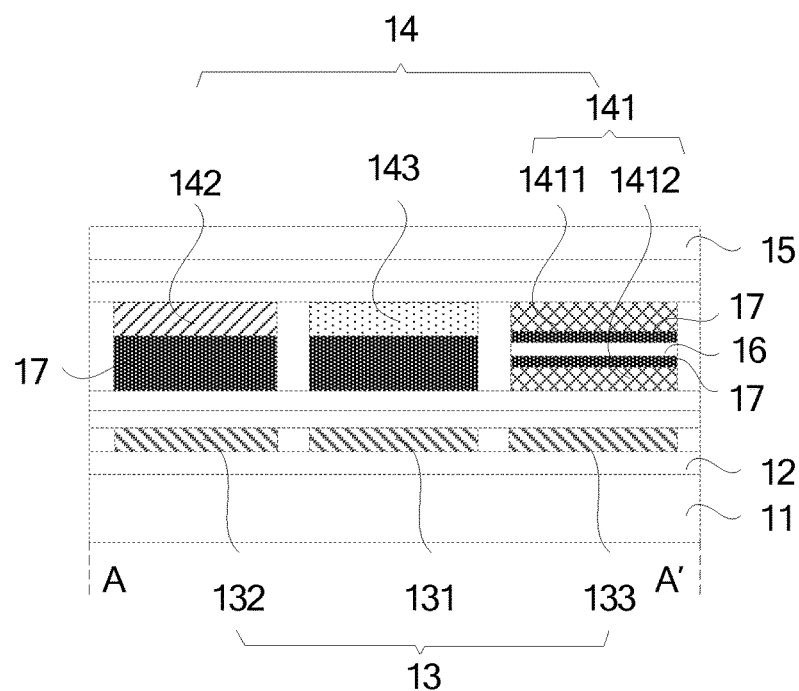
FIG. 5 is a schematic diagram of still another array substrate provided by an embodiment of the present invention.

Optionally, as illustrated in FIG. 5, the light-emitting functional layer further includes an organic light-emitting material layer of a third color (the green organic light-emitting material layer 143), wherein the color decay rate of the organic light-emitting material layer of the first color is greater than a color decay rate of the organic light-emitting material layer of the third color. That is, the color decay rate of the blue organic light-emitting material layer 141 is greater than the color decay rate of the green organic light-emitting material layer 143. The light-emitting functional layer includes the organic light-emitting material layers of three colors, and thus can implement the colorful display by using the three colors.

For example, in a case that the color decay rate of the organic light-emitting material layer of the second color is greater than the color decay rate of the organic light-emitting material layer of the third color, the organic light-emitting material layer of the second color may also include at least two sub-layers, i.e., the first sub-layer and the second sub-layer arranged in a stacking manner, and a display compensation is performed on the organic light-emitting material layer of the second color by using the two sub-layers. Alternatively, in a case that the color decay rate of the organic light-emitting material layer of the third color is greater than the color decay rate of the organic light-emitting material layer of the second color, the organic light-emitting material layer of the third color may also include at least two sub-layers, i.e., the first sub-layer and the second sub-layer arranged in a stacking manner, and a display compensation is performed on the organic light-emitting material layer of the third color by using the two sub-layers.

For example, the organic light-emitting material layer of the third color is provided with the micro-cavity structure adjustment layer on a side of the organic light-emitting material layer of the third color adjacent to the first electrode and/or a side of the organic light-emitting material layer of the third color adjacent to the second electrode; and the micro-cavity structure adjustment layer is used for adjusting the carrier balance, and can also planarize a surface of the light-emitting functional layer, that is, make the light-emitting functional layer have a uniform thickness, thus avoiding an uneven surface of the light-emitting functional layer because the first organic light-emitting material layer includes two sub-layers, i.e., the first sub-layer and the second sub-layer arranged in a stacking manner.

As illustrated in FIG. 5, the green organic light-emitting material layer 143 being provided with the micro-cavity structure adjustment layer 17 on the side of the green organic light-emitting material layer 143 adjacent to the first electrode 13 is taken as an example. If the first electrode 13 is an anode, the micro-cavity structure adjustment layer 17 formed on the side of the green organic light-emitting material layer 143 adjacent to the first electrode may include a hole injection functional layer, a hole transport functional layer, or a laminated layer of the above-described two functional layers. If the first electrode 13 is a cathode, the micro-cavity structure adjustment layer 17 formed on the side of the green organic light-emitting material layer 143 adjacent to the first electrode may include an electron injection functional layer, an electron transport functional layer, or a laminated layer of the above-described two functional layers.

Of course, the green organic light-emitting material layer may also be provided with the micro-cavity structure adjustment layer on the side of the green organic light-emitting material layer adjacent to the second electrode. If the second electrode is an anode, the micro-cavity structure adjustment layer formed on the side of the green organic light-emitting material layer adjacent to the second electrode may include a hole injection functional layer, a hole transport functional layer, or a laminated layer of the above-described two functional layers. If the second electrode is a cathode, the micro-cavity structure adjustment layer formed on the side of the green organic light-emitting material layer adjacent to the second electrode may include an electron injection functional layer, an electron transport functional layer, or a laminated layer of the above-described two functional layers.

Figure 6:
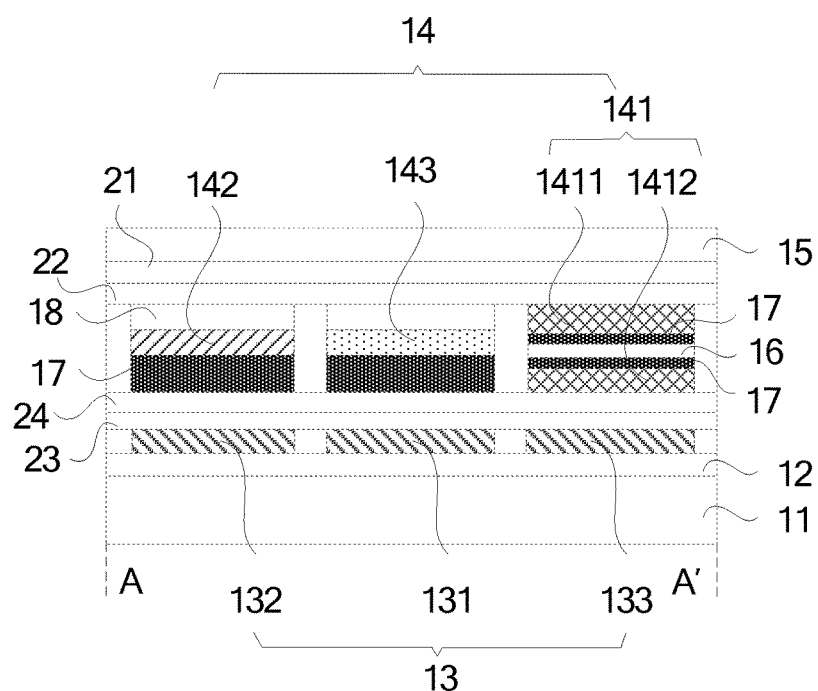
FIG. 6 is a schematic diagram of yet another array substrate provided by an embodiment of the present invention.

For example, the organic light-emitting material layer of the third color is provided with a planarization layer on a side of the organic light-emitting material layer of the third color adjacent to the first electrode and/or a side of the organic light-emitting material layer of the third color adjacent to the second electrode. As illustrated in FIG. 6, the green organic light-emitting material layer 143 being provided with the planarization layer 18 on the side of the green organic light-emitting material layer 143 adjacent to the second electrode 15 is taken as an example. The planarization layer planarizes a surface of the light-emitting functional layer, that is, makes the light-emitting functional layer have a uniform thickness, thus avoiding an uneven surface of the light-emitting functional layer because the first organic light-emitting material layer (the blue organic light-emitting material layer 1411) includes two sub-layers, i.e., the first sub-layer and the second sub-layer arranged in a stacking manner.

For example, with FIG. 6 as an example, the array substrate further comprises: an electron injection functional layer 21 and an electron transport functional layer 22 located between the light-emitting functional layer 14 and the second electrode 15, wherein, the electron injection functional layer 21 is adjacent to the second electrode; and/or, a hole injection functional layer 23 and a hole transport functional layer 24 located between the light-emitting functional layer 14 and the first electrode 13, wherein, the hole injection functional layer 23 is adjacent to the first electrode (i.e., the pixel electrode 13). In FIG. 6, the array substrate further comprises an electron injection functional layer 21, an electron transport functional layer 22, a hole injection functional layer 23 and a hole transport functional layer 24.

In FIG. 6, the array substrate further comprising: the electron injection functional layer 21 and the electron transport functional layer 22 located between the light-emitting functional layer 14 and the second electrode 15, as well as the hole injection functional layer 23 and the hole transport functional layer 24 located between the light-emitting functional layer 14 and the first electrode 13, is taken as an example.

The hole injection functional layer and the hole transport functional layer are conducive to transporting holes; and the electron injection functional layer and the electron transport functional layer are conducive to transporting electrons, so as to improve light-emitting efficiency of the organic light-emitting material layer.

An embodiment of the present invention provides a display device, comprising any of the above-described array substrates provided by the embodiments of the present invention.

Figure 7:
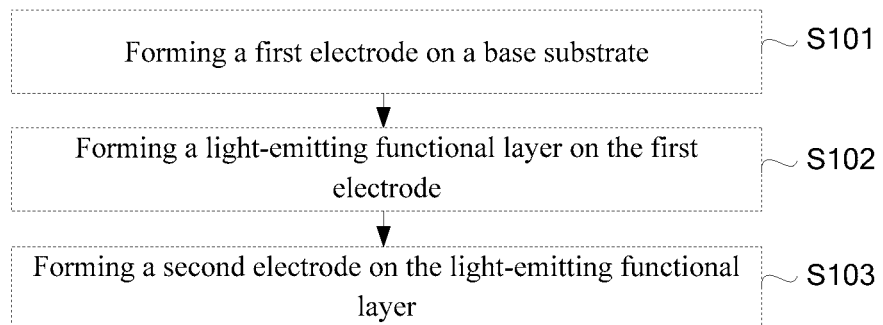
FIG. 7 is a schematic diagram of a manufacturing method of an array substrate provided by an embodiment of the present invention.

An embodiment of the present invention provides a manufacturing method of an array substrate, as illustrated in FIG. 7, comprising the following steps 101-103.

Step 101: forming a first electrode on a base substrate.

For example, the array substrate further comprises a TFT array, etc., and before forming the first electrode on the base substrate, the method further comprises forming the TFT array on the base substrate.

Step 102: forming a light-emitting functional layer on the first electrode.

Optionally, forming the light-emitting functional layer at least includes the following steps 1021 and 1022.

Step 1021: forming an organic light-emitting material layer of a first color, including: forming a first sub-layer of the organic light-emitting material layer of the first color, forming a third electrode on the first sub-layer of the organic light-emitting material layer of the first color, and forming a second sub-layer of the organic light-emitting material layer of the first color on the third electrode. Specifically, the organic light-emitting functional material layer may be formed by evaporating with an FMM, which will not be repeated here.

Step 1022: forming an organic light-emitting material layer of a second color, wherein, a color decay rate of the organic light-emitting material layer of the first color is greater than a color decay rate of the organic light-emitting material layer of the second color. The organic light-emitting material layer of the second color may also be formed by evaporating with the FMM.

Step 103: forming a second electrode on the light-emitting functional layer. The light-emitting functional layer is located between the first electrode and the second electrode.

Optionally, the manufacturing method of the array substrate further comprises: forming a conductive transport layer. The conductive transport layer is insulated from the first electrode and the second electrode, and the conductive transport layer is electrically connected with the third electrode, and transmits an electrical signal to the third electrode.

Figure 8:
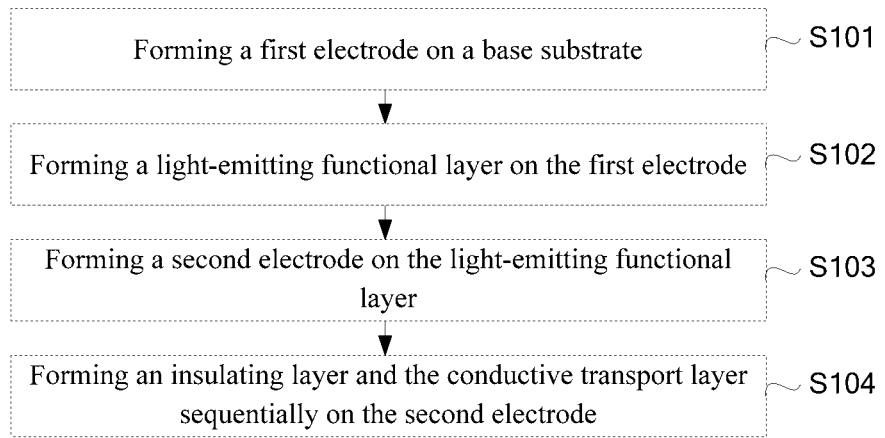
FIG. 8 is a schematic diagram of another manufacturing method of an array substrate provided by an embodiment of the present invention.

For example, the manufacturing method of the array substrate may, as illustrated in FIG. 8, further comprises:

Step 104: forming an insulating layer and a conductive transport layer sequentially on the second electrode.

Since an electric field is formed between the third electrode and the first electrode or the second electrode to drive the first sub-layer or the second sub-layer to emit light, the third electrode is electrically connected with a driving module via other connecting lines so as to receive the electrical signal. For example, the driving module may be electrically connected with the third electrode directly via a connecting lead, to transmit the electrical signal to the third electrode. The array substrate may be further provided with an insulating layer on the second electrode (to be insulated from the second electrode), and then provided with the conductive transport layer on the insulating layer, the conductive transport layer being electrically connected with the third electrode through a via hole, and transmitting the electrical signal to the third electrode.

For example, the above-described step 1021 includes: forming a first sub-layer of the organic light-emitting material layer of the first color, forming a micro-cavity structure adjustment layer on the first sub-layer of the organic light-emitting material layer of the first color, and forming a third electrode on the micro-cavity structure adjustment layer. That is, the micro-cavity structure adjustment layer is formed only on the side of the third electrode adjacent to the first electrode.

Alternatively, the above-described step 1021 includes: forming a first sub-layer of the organic light-emitting material layer of the first color, forming a third electrode on the first sub-layer of the organic light-emitting material layer of the first color, forming a micro-cavity structure adjustment layer on the third electrode, and forming a second sub-layer of the organic light-emitting material layer of the first color on the micro-cavity structure adjustment layer. That is, the micro-cavity structure adjustment layer is formed only on the side of the third electrode adjacent to the second electrode.

Alternatively, the above-described step 1021 includes: forming a first sub-layer of the organic light-emitting material layer of the first color, forming a micro-cavity structure adjustment layer on the first sub-layer of the organic light-emitting material layer of the first color, forming a third electrode on the micro-cavity structure adjustment layer, forming a micro-cavity structure adjustment layer on the third electrode, and forming a second sub-layer of the organic light-emitting material layer of the first color on the micro-cavity structure adjustment layer. That is, as illustrated in FIG. 3, the third electrode 16 is provided with the micro-cavity structure adjustment layers 17 both on a side of the third electrode 16 adjacent to the first electrode 13 and a side of the third electrode 16 adjacent to the second electrode 15.

For example, if the first electrode 13 is an anode, the micro-cavity structure adjustment layer 17 formed on the side of the third electrode 16 adjacent to the first electrode may include a hole injection functional layer, a hole transport functional layer, or a laminated layer of the above-described two functional layers. If the first electrode 13 is a cathode, the micro-cavity structure adjustment layer 17 formed on the side of the third electrode 16 adjacent to the first electrode may include an electron injection functional layer, an electron transport functional layer, or a laminated layer of the above-described two functional layers. The micro-cavity structure adjustment layer not only is used for adjusting carrier balance, but also can planarize a surface of the light-emitting functional layer, that is, make the light-emitting functional layer have a uniform thickness, thus avoiding an uneven surface of the light-emitting functional layer because the first organic light-emitting material layer includes two sub-layers, i.e., the first sub-layer and the second sub-layer arranged in a stacking manner.

For example, after forming the first electrode (i.e., the step 101), and before forming the organic light-emitting material layer of a second color (i.e., the step 1022), the manufacturing method further comprises: forming a micro-cavity structure adjustment layer. Then the step 1022 is: forming an organic light-emitting material layer of the second color on the micro-cavity structure adjustment layer. That is, as illustrated in FIG. 3, the micro-cavity structure adjustment layer 17 is formed between the organic light-emitting material layer of the second color (the red organic light-emitting material layer 142) and the first electrode 13; and since the micro-cavity structure adjustment layer is adjacent to the first electrode, the micro-cavity structure adjustment layer may be a hole injection functional layer, a hole transport functional layer, or a laminated layer of the above-described two functional layers.

Alternatively, after forming the organic light-emitting material layer of a second color (i.e., the step 1022), and before forming the second electrode (i.e., the step 103), the method further comprises: forming a micro-cavity structure adjustment layer on the organic light-emitting material layer of the second color; then the step 103 is: forming the second electrode on the micro-cavity structure adjustment layer. That is, the micro-cavity structure adjustment layer is formed between the organic light-emitting material layer of the second color and the second electrode; and since the micro-cavity structure adjustment layer is adjacent to the cathode, the micro-cavity structure adjustment layer may be an electron injection functional layer, an electron transport functional layer, or a laminated layer of the above-described two functional layers.

Alternatively, after forming the first electrode (i.e., the step 101), and before forming the organic light-emitting material layer of the second color (i.e., the step 1022), the manufacturing method further comprises: forming a micro-cavity structure adjustment layer on the first electrode corresponding to a position where the organic light-emitting material layer of the second color is to be formed; then the step 1022 is: forming the organic light-emitting material layer of the second color on the micro-cavity structure adjustment layer. And after forming the organic light-emitting material layer of the second color (i.e., the step 1022), and before forming the second electrode (i.e., the step 103), the method further comprises: forming the micro-cavity structure adjustment layer on the organic light-emitting material layer of the second color; then the step 103 is: forming the second electrode on the micro-cavity structure adjustment layer. That is, the micro-cavity structure adjustment layers are formed respectively on the side of the organic light-emitting material layer of the second color adjacent to the first electrode, and the side thereof adjacent to the second electrode.

If the first electrode is an anode, the micro-cavity structure adjustment layer formed on the side of the organic light-emitting material layer of the second color adjacent to the first electrode may include a hole injection functional layer, a hole transport functional layer, or a laminated layer of the above-described two functional layers. If the first electrode is a cathode, the micro-cavity structure adjustment layer formed on the side of the organic light-emitting material layer of the second color adjacent to the first electrode may include an electron injection functional layer, an electron transport functional layer, or a laminated layer of the above-described two functional layers.

If the second electrode is an anode, the micro-cavity structure adjustment layer formed on the side of the organic light-emitting material layer of the second color adjacent to the second electrode may include a hole injection functional layer, a hole transport functional layer, or a laminated layer of the above-described two functional layers. If the second electrode is a cathode, the micro-cavity structure adjustment layer formed on the side of the organic light-emitting material layer of the second color adjacent to the second electrode may include an electron injection functional layer, an electron transport functional layer, or a laminated layer of the above-described two functional layers. The micro-cavity structure adjustment layer not only is used for adjusting carrier balance, but also can planarize a surface of the light-emitting functional layer, that is, make the light-emitting functional layer have a uniform thickness, thus avoiding an uneven surface of the light-emitting functional layer because the first organic light-emitting material layer includes two sub-layers, i.e., the first sub-layer and the second sub-layer arranged in a stacking manner.

Optionally, after forming the first electrode (i.e., the step 101), and before forming the organic light-emitting material layer of the second color (i.e., the step 1022), the method further comprises: forming a planarization layer on the first electrode corresponding to the position where the organic light-emitting material layer of the second color is to be formed; then forming the organic light-emitting material layer of the second color is: forming the organic light-emitting material layer of the second color on the planarization layer.

Alternatively, after forming the organic light-emitting material layer of the second color (i.e., the step 1022), and before the forming a second electrode (i.e., the step 103), the method further comprises: forming a planarization layer on the organic light-emitting material layer of the second color; then forming the second electrode is: forming the second electrode on the planarization layer. That is, as illustrated in FIG. 4, the planarization layer 18 is formed on the organic light-emitting material layer of the second color (the green organic light-emitting material layer 142).

Alternatively, after the step 101, and before the step 1022, the method further comprises: forming a planarization layer; then the step 1022 is: forming the organic light-emitting material layer of the second color on the planarization layer. And after the step 1022, and before the step 103, the method further comprises: forming a planarization layer; then step 103 is: forming the second electrode on the planarization layer.

The planarization layer planarizes a surface of the light-emitting functional layer, that is, makes the light-emitting functional layer have a uniform thickness, thus avoiding an uneven surface of the light-emitting functional layer because the first organic light-emitting material layer (the blue organic light-emitting material layer 1411) includes two sub-layers, i.e., the first sub-layer and the second sub-layer arranged in a stacking manner.

Optionally, the above-described step 102 further includes: step 1023: forming an organic light-emitting material layer of a third color. The color decay rate of the organic light-emitting material layer of the first color is greater than a color decay rate of the organic light-emitting material layer of the third color. The light-emitting functional layer includes organic light-emitting material layers of three colors, and as illustrated in FIG. 5, the light-emitting functional layer 14 includes a red organic light-emitting material layer 142, a green organic light-emitting material layer 143 and a blue organic light-emitting material layer 141, and thus can implement the colorful display by the three colors.

For example, after forming the first electrode (i.e., the step 101), and before forming the organic light-emitting material layer of the third color (i.e., the step 1023), the method further comprises: forming a micro-cavity structure adjustment layer on the first electrode corresponding to a position where the organic light-emitting material layer of the third color is to be formed; then forming the organic light-emitting material layer of a third color (i.e., the step 1023) is: forming the organic light-emitting material layer of the third color on the micro-cavity structure adjustment layer. As illustrated in FIG. 5, the green organic light-emitting material layer 143 is formed on the micro-cavity structure adjustment layer 17, so as to adjust carrier balance of the green organic light-emitting material layer 143.

Alternatively, after forming the organic light-emitting material layer of the third color (i.e., the step 1023), and before forming the second electrode (i.e., the step 103), the method further comprises: forming a micro-cavity structure adjustment layer on the light-emitting material layer of the third color; then forming the second electrode (i.e., the step 103) is: forming the second electrode on the micro-cavity structure adjustment layer.

Alternatively, after the step 101, and before the step 1023, the method further comprises: forming a micro-cavity structure adjustment layer; then the step 1023 is: forming the organic light-emitting material layer of the third color on the micro-cavity structure adjustment layer. And after the step 1023, and before the step 103, the method further comprises: forming a micro-cavity structure adjustment layer; then the step 103 is: forming the second electrode on the micro-cavity structure adjustment layer.

For example, if the first electrode is an anode, the micro-cavity structure adjustment layer formed on the side of the green organic light-emitting material layer adjacent to the first electrode may include a hole injection functional layer, a hole transport functional layer, or a laminated layer of the above-described two functional layers. If the first electrode is a cathode, the micro-cavity structure adjustment layer formed on the side of the green organic light-emitting material layer adjacent to the first electrode may include an electron injection functional layer, an electron transport functional layer, or a laminated layer of the above-described two functional layers. If the second electrode is an anode, the micro-cavity structure adjustment layer formed on the side of the green organic light-emitting material layer adjacent to the second electrode may include a hole injection functional layer, a hole transport functional layer, or a laminated layer of the above-described two functional layers. If the second electrode is a cathode, the micro-cavity structure adjustment layer formed on the side of the green organic light-emitting material layer adjacent to the second electrode may include an electron injection functional layer, an electron transport functional layer, or a laminated layer of the above-described two functional layers.

Optionally, after forming the first electrode (i.e., the step 101), and before forming the organic light-emitting material layer of the third color (i.e., the step 1023), the method further comprises: forming a planarization layer on the first electrode corresponding to the position where the light-emitting material layer of the third color is to be formed; then forming the organic light-emitting material layer of the third color (i.e., the step 1023) is: forming the organic light-emitting material layer of the third color on the planarization layer.

Alternatively, after forming the organic light-emitting material layer of the third color (i.e., the step 1023), and before forming the second electrode (i.e., the step 103), the method further comprises: forming a planarization layer on the light-emitting material layer of the third color; then forming the second electrode (i.e., the step 103) is: forming the second electrode on the planarization layer.

Alternatively, after the step 101, and before the step 1023, the method further comprises: forming a planarization layer; then the step 1023 is: forming the organic light-emitting material layer of the third color on the planarization layer. And after the step 1023, and before the step 103, the method further comprises: forming a planarization layer; then the step 103 is: forming the second electrode on the planarization layer.

The planarization layer planarizes a surface of the light-emitting functional layer, that is, makes the light-emitting functional layer have a uniform thickness, thus avoiding an uneven surface of the light-emitting functional layer because the first organic light-emitting material layer includes two sub-layers, i.e., the first sub-layer and the second sub-layer arranged in a stacking manner.

In the description of the present invention, it should be noted that, azimuth or positional relationships indicated by terms such as "up", "down" and so on, are based on the azimuth or positional relationships illustrated in the drawings, which are only to facilitate description of the invention and simplify the description, but not to indicate or imply that the device or components must have a specific azimuth, or be constructed or operated in the specific azimuth, which thus cannot be understood as a limitation to the invention.

Figure 9:
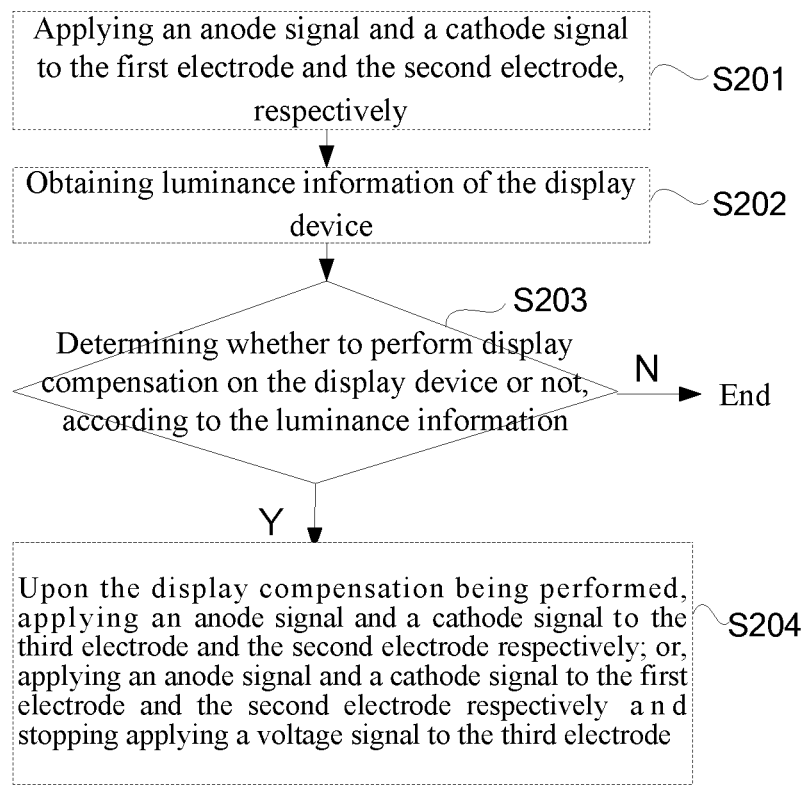
FIG. 9 is a schematic diagram of a display compensation method provided by an embodiment of the present invention.

An embodiment of the present invention provides a display compensation method, applied in the display device provided by the embodiment of the present invention, and as illustrated in FIG. 9, the display compensation method comprises the following steps 201-204.

Step 201: applying an anode signal and a cathode signal to the first electrode and the second electrode, respectively.

An electric field is formed between the first electrode and the third electrode, to drive the first sub-layer to emit light, and at the same time, the second sub-layer is turned off For example, an anode signal may be provided for the first electrode, and a cathode signal is provided for the second electrode, then the first electrode is an anode, and the second electrode is a cathode; or a cathode signal may be provided for the first electrode, and an anode signal may be provided for the second electrode, then the first electrode is a cathode, and the second electrode is an anode.

Step 202: obtaining luminance information of the display device.

Specifically, a color coordinate of the display device may be obtained; and of course, current in a cathode or anode of the display device may also be obtained. In the embodiment of the present invention, it is described with obtaining the color coordinate of the display device as an example.

Step 203: determining whether to perform a display compensation on the display device or not, according to the luminance information.

If the above-described step 202 is obtaining a color coordinate of the display device, the step 203 is, for example: determining whether luminance decay of the organic light-emitting material layer of the first color of the display device is greater than 40% or not. If the luminance decay of the organic light-emitting material layer of the first color of the display device is greater than 40%, the display compensation is performed on the display device; and if the luminance decay of the organic light-emitting material layer of the first color of the display device is less than or equal to 40%, the display compensation is not performed on the display device.

Step 204: applying an anode signal and a cathode signal to the third electrode and the second electrode respectively and stopping applying a voltage signal to the first electrode; or, applying an anode signal and a cathode signal to the first electrode and the second electrode respectively and stopping applying a voltage signal to the third electrode, in a case that the display compensation is performed on the display device.

In a case that the display compensation is not performed on the display device, the display device operates according to an initial setting, that is, ends the display compensation.

For example, in a case that the luminance decay of the organic light-emitting material layer of the first color is greater than 40% and is less than or equal to 60%, an anode signal and a cathode signal are applied to the third electrode and the second electrode, respectively, and no voltage signal is applied to the first electrode.

At this time, an electric field is formed between the third electrode and the second electrode, to drive the second sub-layer to display, and at this time, the first sub-layer is turned off.

For example, an anode signal may be provided for the third electrode, and a cathode signal is provided for the second electrode, then the third electrode is an anode, and the second electrode is a cathode. Or, a cathode signal may be provided for the third electrode, and an anode signal may be provided for the second electrode, then the third electrode is a cathode, and the second electrode is an anode.

For example, in a case that the luminance decay of the organic light-emitting material layer of the first color is greater than 60%, an anode signal and a cathode signal are provided for the first electrode and the second electrode, respectively, and no voltage signal is applied to the third electrode.

At this time, an electric field is formed between the first electrode and the second electrode, to drive the first sub-layer and the second sub-layer to display simultaneously, and to improve the luminance of the organic light-emitting material layer of the first color, so as to perform color compensation on the same.

For example, an anode signal may be provided for the first electrode, and a cathode signal is provided for the second electrode, then the first electrode is an anode, and the second electrode is a cathode. Or, a cathode signal may be provided for the first electrode, and an anode signal may be provided for the second electrode, then the first electrode is a cathode, and the second electrode is an anode.

It should be noted that, the display compensation can be implemented in various modes of providing signals as described above. However, before manufacturing of the array substrate, it can be determined in which display compensation mode the display compensation is performed according to needs; thereafter, the specific positions of the corresponding functional layers such as the micro-cavity structure adjustment layer are defined according to the specific compensation mode, when the array substrate is formed; and after array substrate is formed, the display compensation is performed according to the display compensation mode determined previously.

It should be noted that, the luminance decay of the organic light-emitting material layer of the first color may be reflected in various ways, and the embodiment of the present invention is described in detail with the color coordinate as an example.

The foregoing embodiments merely are exemplary embodiments of the invention, and not intended to define the scope of the invention, and the scope of the invention is determined by the appended claims.

The present application claims priority of Chinese Patent Application No. 201510092283.1 filed on Feb. 28, 2015, the disclosure of which is incorporated herein by reference in its entirety as part of the present application.

What is claimed is:

1. An array substrate, comprising a base substrate; a first electrode, a second electrode and a light-emitting functional layer located between the first electrode and the second electrode, which are formed on the base substrate, wherein, the light-emitting functional layer at least includes an organic light-emitting material layer of a first color and an organic light-emitting material layer of a second color, a color decay rate of the organic light-emitting material layer of the first color being greater than a color decay rate of the organic light-emitting material layer of the second color; and the organic light-emitting material layer of the first color at least includes a first sub-layer and a second sub-layer arranged in a stacking manner, and a third electrode is disposed between the first sub-layer and the second sub-layer.

2. The array substrate according to claim 1, wherein, the third electrode is provided with a micro-cavity structure adjustment layer on a side of the third electrode adjacent to the first sub-layer and/or a side of the third electrode adjacent to the second sub-layer, the micro-cavity structure adjustment layer being configured to adjust carrier balance.

3. The array substrate according to claim 1, wherein, the array substrate further comprises a conductive transport layer, the conductive transport layer being insulated from the first electrode and the second electrode, and the conductive transport layer being electrically connected with the third electrode, and configured to transmit an electrical signal to the third electrode.

4. The array substrate according to claim 1, wherein, the organic light-emitting material layer of the second color is provided with a micro-cavity structure adjustment layer on a side of the organic light-emitting material layer of the second color adjacent to the first electrode and/or a side of the organic light-emitting material layer of the second color adjacent to the second electrode, the micro-cavity structure adjustment layer being configured to adjust carrier balance.

5. The array substrate according to claim 1, wherein, the organic light-emitting material layer of the second color is provided with a planarization layer on a side of the organic light-emitting material layer of the second color adjacent to the first electrode and/or a side of the organic light-emitting material layer of the second color adjacent to the second electrode.

6. The array substrate according to claim 1, wherein, the light-emitting functional layer further includes an organic light-emitting material layer of a third color, the color decay rate of the organic light-emitting material layer of the first color being greater than a color decay rate of the organic light-emitting material layer of the third color.

7. The array substrate according to claim 6, wherein, the organic light-emitting material layer of the third color is provided with a micro-cavity structure adjustment layer on a side of the organic light-emitting material layer of the third color adjacent to the first electrode and/or a side of the organic light-emitting material layer of the third color adjacent to the second electrode, the micro-cavity structure adjustment layer being configured to adjust carrier balance.

8. The array substrate according to claim 6, wherein, the organic light-emitting material layer of the third color is provided with a planarization layer on a side of the organic light-emitting material layer of the third color adjacent to the first electrode and/or a side of the organic light-emitting material layer of the third color adjacent to the second electrode.

9. A display device, comprising the array substrate according to claim 1.

10. The display device according to claim 9, wherein, the third electrode is provided with a micro-cavity structure adjustment layer on a side of the third electrode adjacent to the first sub-layer and/or a side of the third electrode adjacent to the second sub-layer, the micro-cavity structure adjustment layer being configured to adjust carrier balance.

11. The display device according to claim 9, wherein, the array substrate further comprises a conductive transport layer, the conductive transport layer being insulated from the first electrode and the second electrode, and the conductive transport layer being electrically connected with the third electrode, and configured to transmit an electrical signal to the third electrode.

12. The display device according to claim 9, wherein, the organic light-emitting material layer of the second color is provided with a micro-cavity structure adjustment layer on a side of the organic light-emitting material layer of the second color adjacent to the first electrode and/or a side of the organic light-emitting material layer of the second color adjacent to the second electrode, the micro-cavity structure adjustment layer being configured to adjust carrier balance.

13. The display device according to claim 9, wherein, the organic light-emitting material layer of the second color is provided with a planarization layer on a side of the organic light-emitting material layer of the second color adjacent to the first electrode and/or a side of the organic light-emitting material layer of the second color adjacent to the second electrode.

14. The display device according to claim 9, wherein, the light-emitting functional layer further includes an organic light-emitting material layer of a third color, the color decay rate of the organic light-emitting material layer of the first color being greater than a color decay rate of the organic light-emitting material layer of the third color.

15. The display device according to claim 14, wherein, the organic light-emitting material layer of the third color is provided with a micro-cavity structure adjustment layer on a side of the organic light-emitting material layer of the third color adjacent to the first electrode and/or a side of the organic light-emitting material layer of the third color adjacent to the second electrode, the micro-cavity structure adjustment layer being configured to adjust carrier balance.

16. The display device according to claim 14, wherein, the organic light-emitting material layer of the third color is provided with a planarization layer on a side of the organic light-emitting material layer of the third color adjacent to the first electrode and/or a side of the organic light-emitting material layer of the third color adjacent to the second electrode.

17. A display compensation method, applied in the display device according to claim 9, the method comprising:
applying an anode signal and a cathode signal to the first electrode and the second electrode, respectively;
obtaining luminance information of the display device;
determining whether to perform a display compensation on the display device or not, according to the luminance information; and
upon the display compensation being performed, applying an anode signal and a cathode signal to the third electrode and the second electrode respectively and stopping applying a voltage signal to the first electrode; or, applying an anode signal and a cathode signal to the first electrode and the second electrode respectively and stopping applying a voltage signal to the third electrode.

18. The method according to claim 17, wherein, obtaining the luminance information of the display device comprising: obtaining a color coordinate of the display device.

19. The method according to claim 18, wherein, determining whether to perform the display compensation on the display device or not according to the luminance information comprising:
determining whether luminance decay of the organic light-emitting material layer of the first color of the display device is greater than 40% or not according to the color coordinate; performing the display compensation in a case that the luminance decay of the organic light-emitting material layer of the first color of the display device is greater than 40%.

20. The method according to claim 18, wherein,
in a case that the luminance decay of the organic light-emitting material layer of the first color is greater than 40% and is less than or equal to 60%, an anode signal and a cathode signal are applied to the third electrode and the second electrode, respectively, and no voltage signal is applied to the first electrode; in a case that the luminance decay of the organic light-emitting material layer of the first color is greater than 60%, an anode signal and a cathode signal are provided for the first electrode and the second electrode, respectively, and no voltage signal is applied to the third electrode.

* * * * *